(12) United States Patent
Cheng

(10) Patent No.: US 7,455,102 B2
(45) Date of Patent: *Nov. 25, 2008

(54) METHOD FOR MANUFACTURING HEAT PIPE COOLING DEVICE

(75) Inventor: Chih-Hung Cheng, Wugu Township, Taipei County (TW)

(73) Assignee: Golden Sun News Techniques Co., Ltd., Taipei (TW)

( * ) Notice: Subject to any disclaimer, the term of this patent is extended or adjusted under 35 U.S.C. 154(b) by 403 days.

This patent is subject to a terminal disclaimer.

(21) Appl. No.: 11/313,917

(22) Filed: Dec. 22, 2005

(65) Prior Publication Data

US 2007/0144710 A1    Jun. 28, 2007

(51) Int. Cl.
*H05K 7/20* (2006.01)
(52) U.S. Cl. .................................. 165/104.33; 361/700
(58) Field of Classification Search ............ 165/104.33; 361/700
See application file for complete search history.

(56) References Cited

U.S. PATENT DOCUMENTS

| | | | | |
|---|---|---|---|---|
| 6,830,098 B1* | 12/2004 | Todd et al. | | 165/104.33 |
| 6,915,844 B2* | 7/2005 | Chou | | 165/104.33 |
| 6,938,682 B2* | 9/2005 | Chen et al. | | 165/104.33 |
| 6,945,319 B1* | 9/2005 | Li et al. | | 165/104.33 |
| 6,978,829 B1* | 12/2005 | Lin | | 165/104.33 |
| 7,021,368 B2* | 4/2006 | Lin et al. | | 165/104.33 |
| 2003/0102108 A1* | 6/2003 | Sarraf et al. | | 165/80.3 |
| 2003/0218849 A1* | 11/2003 | Mochizuki et al. | | 361/103 |
| 2005/0257920 A1* | 11/2005 | Sheng et al. | | 165/104.33 |
| 2006/0011329 A1* | 1/2006 | Wang et al. | | 165/104.33 |
| 2006/0082972 A1* | 4/2006 | Kim | | 361/709 |

* cited by examiner

*Primary Examiner*—Allen J Flanigan

(57) ABSTRACT

A method for manufacturing a heat pipe cooling device. The heat pipe cooling device includes a U-shaped heat pipe, which is embedded within a heat conductor. The heat conductor includes a rectangular base and an upper cover connected to the base. The base includes many retaining grooves which allow the absorption end of the heat pipe to be disposed therein. The upper cover includes many through holes formed thereon corresponding to the cooling end of the heat pipe. The bottom surface includes many protrusive portions corresponding to the inner side of the absorption end of the heat pipe. Furthermore, the upper cover and the base both include a positioning portion for engaging each other. In this manner, the upper cover is pressed on the cooling end of the heat pipe. The protrusive portion will push the heat pipe to tightly contact with the base. Finally, a planarization process is performed, thereby making the bottom surface of the absorption end and the bottom surface of the heat conductor to form a flat surface.

11 Claims, 8 Drawing Sheets

METHOD FOR MANUFACTURING HEAT PIPE COOLING DEVICE

BACKGROUND OF THE INVENTION

The present invention relates generally to a method for manufacturing a cooling device, and more particularly to a method for manufacturing a cooling device. The heat pipe of the cooling device contacts the heat source directly.

The operation of electronic products, such as personal computer, light emitting laser diode or dynamic transistor, will dissipate heat. For the recently developed electronic devices, more and more heat is generated therefrom. Cooling technology thus becomes one of the key technologies of electronic industry. Typical cooling devices for electronic products are divided into two categories. One type of the cooling devices includes a cooling body installed directly on the heat generating electronic device. The other type of the cooling devices includes a fan for lowering the temperature in the housing of the electronic device.

The cooling device installed on electronic products is normally made of materials of high heat conductivity. For example, copper or aluminum is used to fabricate a flat base, a flat heat pipe or a cylindrical heat pipe. The heat pipe is a hollow container evacuated to certain degree of vacuum, wherein a working fluid is properly enclosed. Since the container is evacuated, the working fluid is easily evaporated due to the absorbed heat.

The working principle of the heat pipe described in the following. In general, the heat pipe includes an absorption end and a cooling end. The absorption end contacts the heat source and absorb heat generated therefrom. The absorbed heat is transferred to the working fluid, thereby evaporating the working fluid. The working fluid is then transported to the cooling end and is condensed back to liquid. The condensed working fluid then returns to the absorption end, thereby forming a heat transfer cycle. The circulation of working fluid within the heat pipe is enhanced by gravity or capillary effect. The former disposes the absorption end lower than the cooling end, while the later employs retaining grooves, a metallic web or a porous material formed on the inner wall of the container. Therefore, a huge amount of heat is transferred and dissipated by the phase transition of the working fluid enclosed in the heat pipe.

Further, a heat dissipater can also be used to dissipate heat generated from an electronic device. The heat dissipater includes a heat conductor and a set of cooling fins. Conventional cooling fins includes a set of leaves extended outward, which is connected to the heat conductor by copper soldering or extrusion. The cooling fins and the heat conductor of the heat dissipater are made of materials of high heat conductivity.

Since the heat conductivity of the heat pipe is hundreds of times higher than that of copper, the price thereof is for sure much higher. If a few coupled heat pipes are required to install on a heat generating device, the cost so rendered will certainly become an obstacle for commercializing the product. On the other hand, the advancement of electronic technology gives rise to electronic products that generate more and more heat. Simply using the heat dissipater composed of a heat conductor and cooling fins can not meet the heating requirement. Therefore, a compromised heat pipe cooling device is developed, which includes a heat conductor, a set of cooling fins and a heat pipe. The cooling end of the heat pipe penetrates through the hole formed on each cooling fin. In addition, a plurality of parallel grooves are formed on the heat conductor, thereby soldering with the absorption end of the heat pipe. Consequently, the heat conductor contacting a heat generating electronic device will transfer the heat from the electronic device to the heat pipe and the cooling fins.

However, the conventional heat pipe cooling device requires a soldering layer for connecting the heat pipe and the heat conductor. The soldering process requires heating the heat pipe and the heat conductor, which will form a black copper oxide layer on the surface of the copper heat pipe. Therefore, an additional oxidation reduction process is necessary to recover to its original color, which will increase the time and the cost for fabrication. Moreover, the soldering material will reduce the heat conductivity of the heat conductor. Finally, since the heat pipe, which has a heat conductivity of the heat pipe is much larger than that of the heat conductor, is not adhered to the heat generating electronic device, the performance of such a conventional cooling device is thus very much restricted.

BRIEF SUMMARY OF THE INVENTION

Since the heat conductivity of the heat pipe is much larger than that of the copper heat conductor, directly contacting the heat pipe to the heat generating electronic device will enhance the efficiency of heat transfer. For this reason, a heat pipe cooling device, which includes a cooling end embedded in a heat conductor, is developed, so as to contact both the heat conductor and the heat pipe to a heat generating electronic device, as shown in FIG. 2. Therefore, one objective of the present invention is to provide a method for manufacturing a heat pipe cooling device that allows both the heat pipe and the heat conductor to contact the heat generating electronic device.

Another, the present invention is to provide a method for manufacturing a heat pipe cooling device, which does not requires a third media. Since the combination of the heat pipe and the heat conductor is normally achieved by a soldering processing, the low heat conductivity of the soldering material will form a thermal resistance on the interface, which will reduce the efficiency of heat transfer. It is more reasonable to combine the heat pipe and the heat conductor via direct connection, so as to eliminate the effect of thermal resistance.

In the present invention, an upper cover is used to press the heat pipe to the heat conductor. Therefore, the manufacturing process does not require a soldering process and an oxidation reduction process, which will largely enhance the production yield and reduce the production cost. Therefore, yet another objective of the present invention is to provide a quick and cost effective method for manufacturing the heat pipe cooling device.

In summary, the heat pipe cooling device manufactured in accordance to the present invention includes a heat pipe, which is embedded into a retaining groove formed on a heat conductor. The heat conductor includes a rectangular upper cover and a base connected to the upper cover. The base includes a plurality of retaining grooves, the size and shape of which is substantially the same as that of the absorption end of the U-shaped heat pipe.

Further, a plurality of through holes is formed on the upper cover corresponding to the cooling end of the heat pipe. The bottom surface of the upper cover includes a plurality of arc shaped protrusive portions, which corresponds to the inner side of the absorption end of the heat pipe. The upper cover and the base both includes a positioning portion for engaging with each other. The cooling end of the heat pipe thus penetrates through the upper cover. The upper cover then presses the absorption end of the heat pipe into the retaining groove of the base. The protrusive portion tightly contacts the heat pipe with the base. Finally, a planarization process is performed to the bottom surface of the absorption end and the bottom surface of the heat conductor, thereby making the bottom surface of the absorption end and the bottom surface of the heat conductor to form a flat surface.

DETAILED DESCRIPTION OF THE INVENTION

In order to better understanding the features and technical contents of the present invention, the present invention is hereinafter described in detail by incorporating with the accompanying drawings. However, the accompanying drawings are only for the convenience of illustration and description, no limitation is intended thereto.

Figure 1:
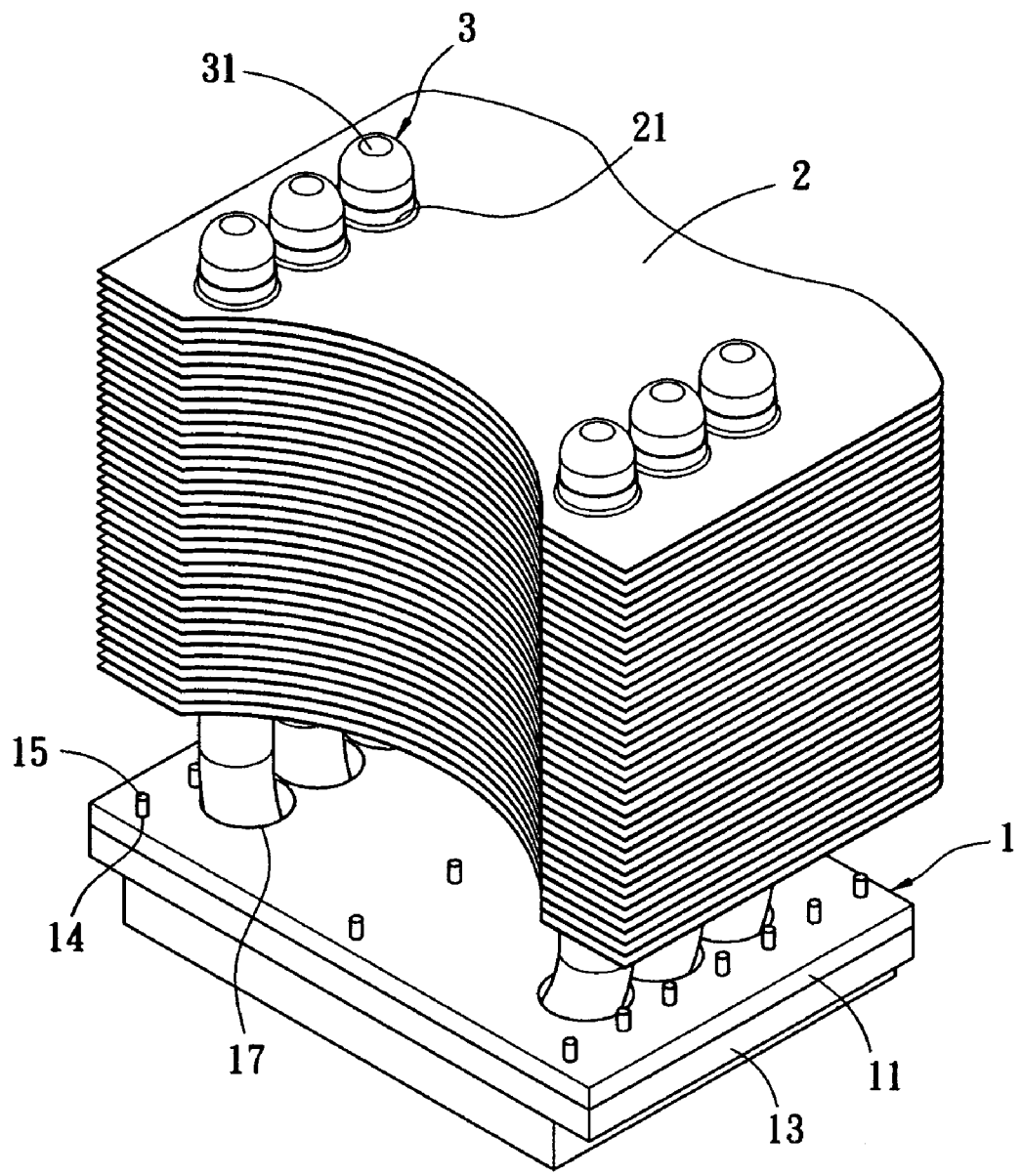
FIG. 1 is a perspective view illustrating a heat pipe cooling device of the present invention.

The present invention provides a method for manufacturing a heat pipe cooling device. A perspective view of the cooling device is illustrated in FIG. 1. As shown, the cooling device includes a plurality of fins 2 stacked on the heat conductor 1. The heat conductor 1 and the fins 2 are made of materials of high heat conductivity, e.g. aluminum or copper. Meanwhile, a plurality of holes 21 is formed on the fins 2 corresponding to the heat pipe 3.

As shown in FIG. 1, the heat pipe 3 is a U-shaped hollow tube. Any person having ordinary skill in the art would readily appreciate that many other shaped heat pipes are considered within the scope of the present invention. A working fluid is properly enclosed within the heat pipe 3. The two end portions of the U-shaped heat pipe 3 defines a cooling end 31, while the center portion of the heat pipe 3 defines an absorption end 33. The cooling end 31 is disposed away from the heat conductor 1, and penetrates through the holes 21 of the fins 2 for connecting with the fins.

Figure 2:
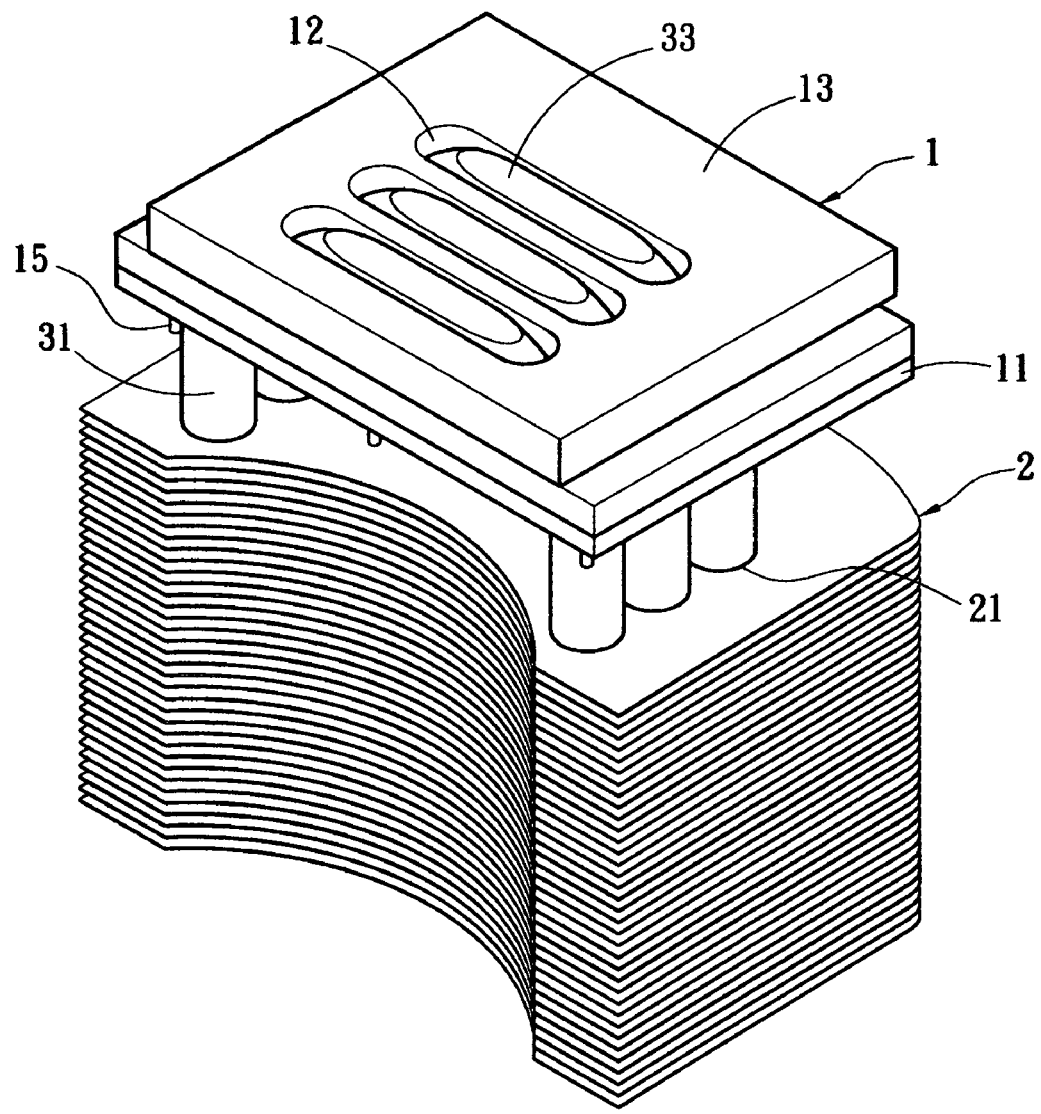
FIG. 2 is a perspective view illustrating the heat pipe cooling device of the present invention in another viewing angle.
Figure 3:
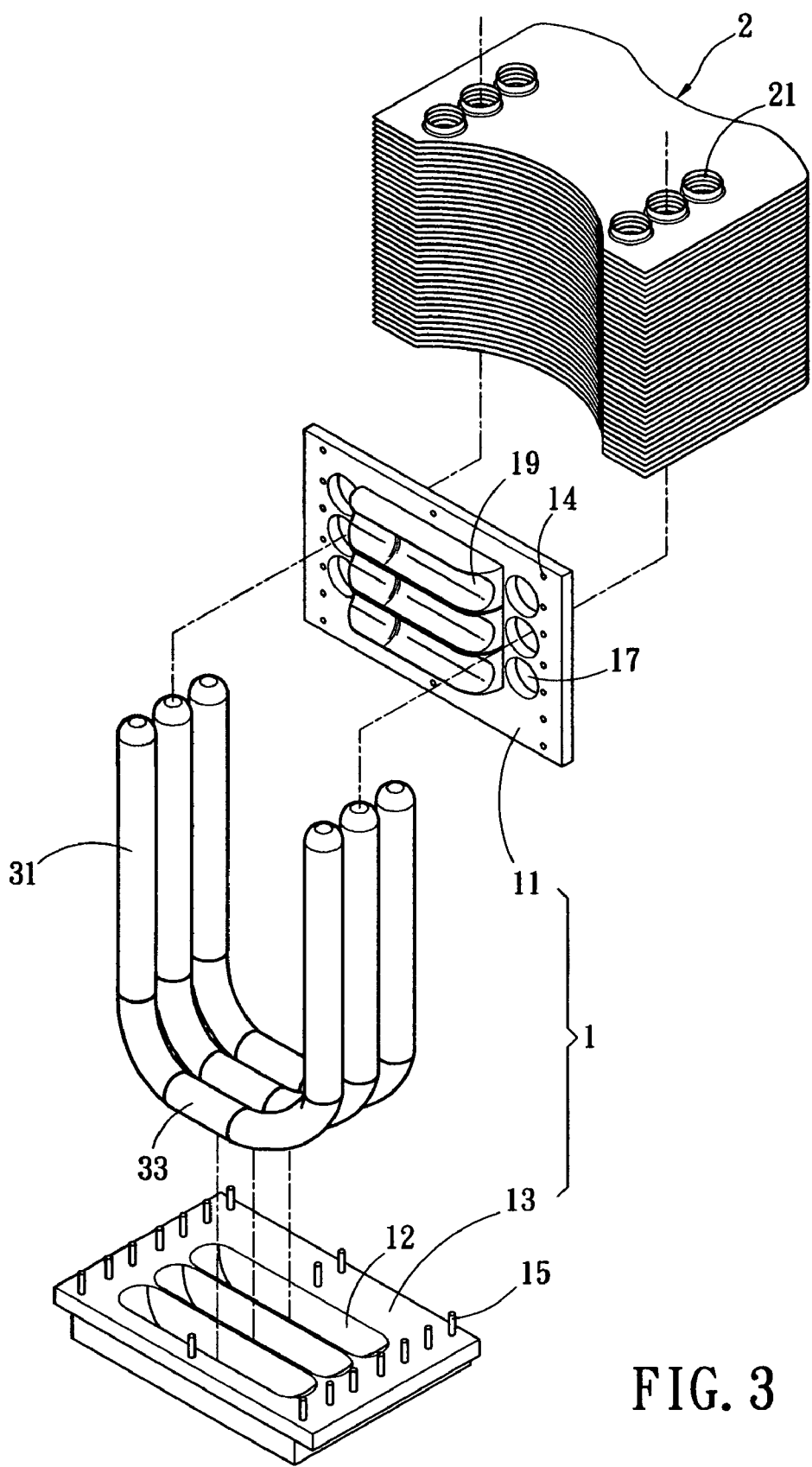
FIG. 3 is an explosive view illustrating the heat pipe cooling device of the present invention.

Referring to FIG. 2, a perspective view of the present invention in another viewing angle is illustrated. As shown, the bottom portion of the absorption end 33 is a flat surface parallel to the bottom surface of the heat conductor 1. The flat surface contacts the surface of the heat generating electronic device. Referring to FIG. 3, an explosive view of the heat pipe cooling device of the present invention is illustrated. As shown, the heat conductor 1 includes a base 13 and a substantially rectangular upper cover 11 disposed on the base 13. A plurality of retaining grooves 12 is formed on the base 13. The shape and the size of the retaining grooves 12 are substantially the same as that of the absorption end 33 of the U-shaped heat pipe 3.

Referring again to FIG. 3, a plurality of through holes 17 are formed on the upper cover 11, which corresponds to the cooling end 31 of the heat pipe 3. The inner radius of the through holes 17 is substantially the same as that of the outer radius of the cooling end 31. In addition, the upper cover 11 includes a plurality of protrusive portions 19. The arc shape of the protrusive portions 19 corresponds to that of the absorption end 33 of the heat pipe 3. Therefore, the cooling end 31 can penetrate through the upper cover 11 via the through holes 17 and be disposed thereon. Thus, the protrusive portion 19 can contact and compress the absorption end 33 into the retaining groove 12, thereby securely contacting the absorption end 33 and the retaining groove 12. Therefore, the heat pipe 3 is securely fastened to the heat conductor 1.

Therefore, the method for manufacturing the heat pipe cooling device is illustrated in FIG. 4 to FIG. 7. The method includes the following steps.

Figure 4:
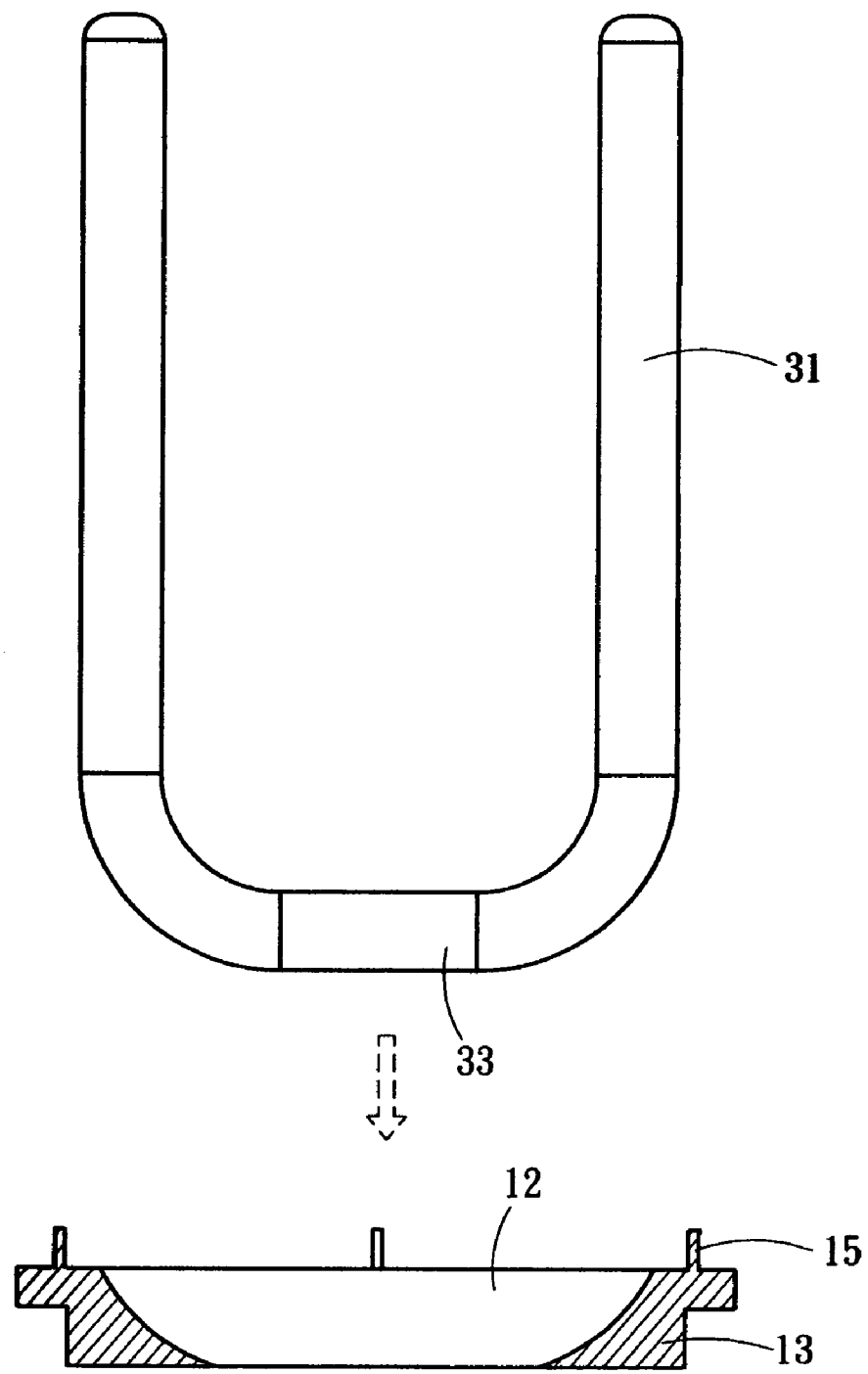
FIG. 4 is a side view illustrating the first manufacturing step of the present invention.

(1) As shown in FIG. 4, at least a retaining groove 12 is formed on the base 13 that can be completely adhered to and covered on the heat generating electronic device. The shape of the retaining groove 12 corresponds to that of the absorption end 33 of the heat pipe 3.

(2) A plurality of the second positioning portion 15 is formed and distributed on the base 13.

(3) The absorption end 33 of the heat pipe 3 is disposed in the retaining groove 12.

Figure 5:
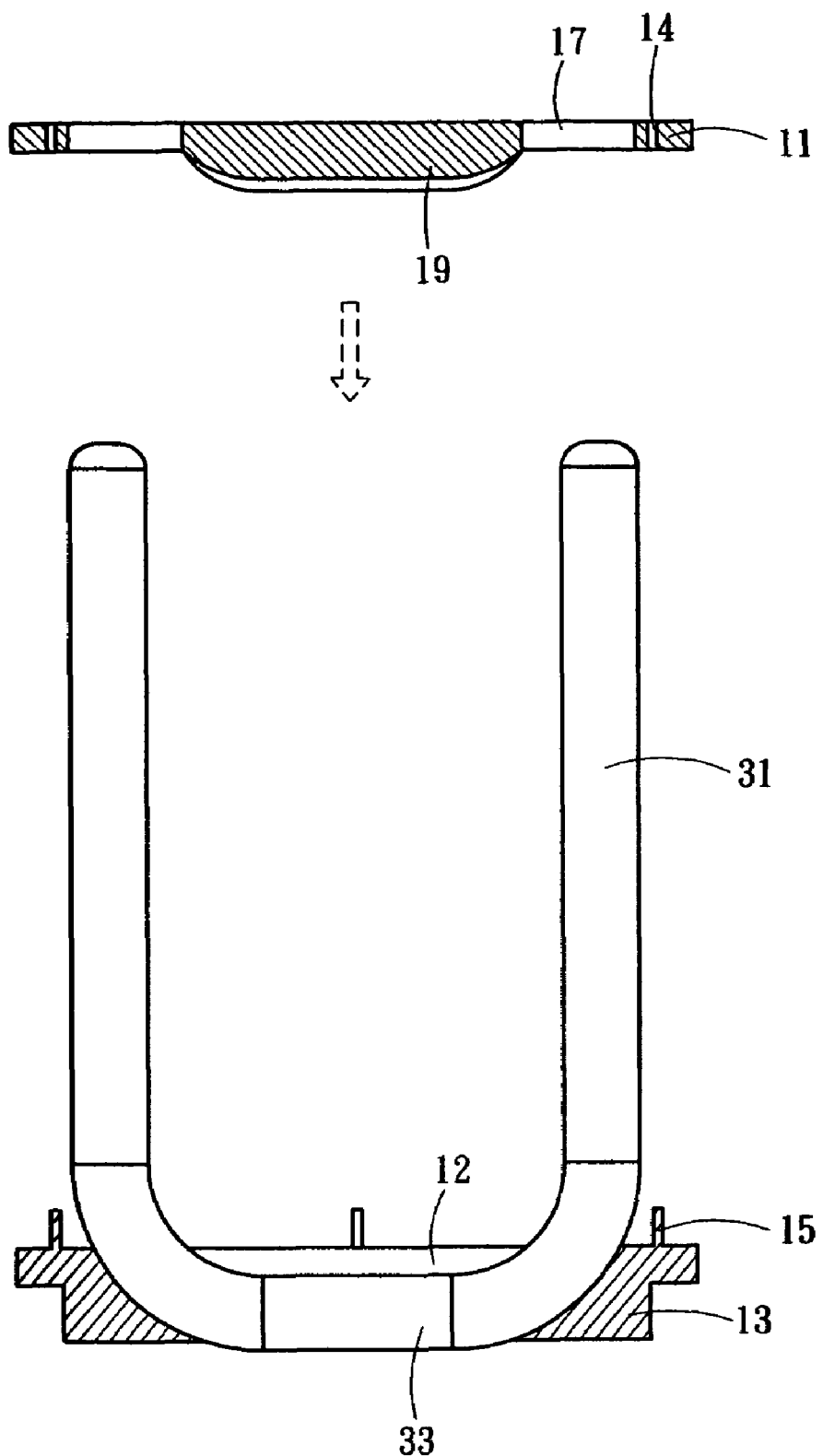
FIG. 5 is a side view illustrating the second manufacturing step of the present invention.
Figure 6:
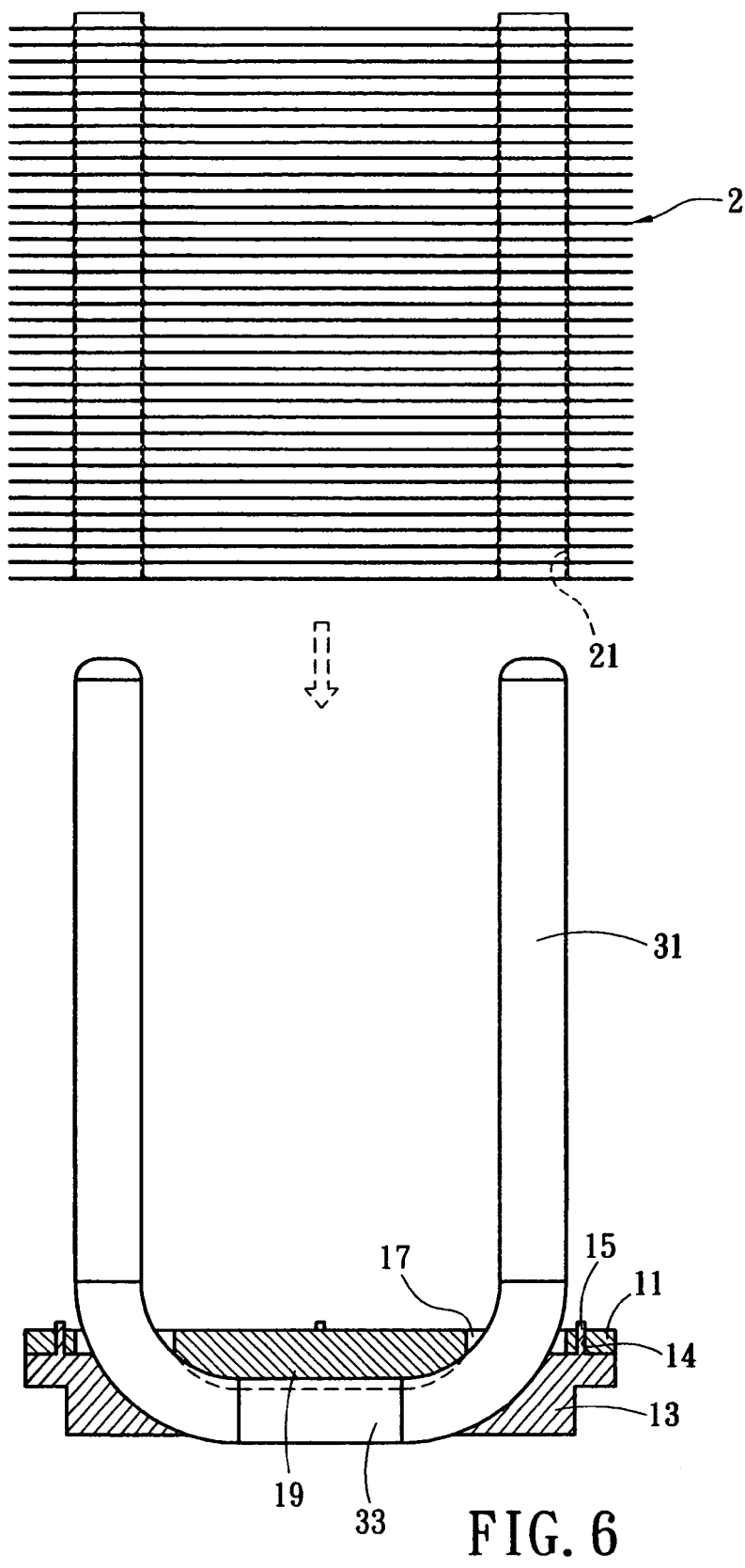
FIG. 6 is a side view illustrating the third manufacturing step of the present invention.

(4) As shown in FIG. 5, a plurality of through holes 17 is formed on the upper cover 11 that can tightly cover the base 13. The position of the through holes 17 corresponds to the cooling end 31 of the heat pipe 2. The radius of the through holes 17 is substantially equal to the outer radius of the cooling end 31.

(5) A plurality of first positioning portion 14 is formed and homogeneously distributed on the bottom surface of the upper cover 11. The position and the shape of the first positioning portion 14 correspond to that of the second positioning portion 15.

(6) A protrusive portion 19 is formed on the bottom surface of the upper cover 11, the shape of which corresponds to that of the absorption end 33 of the heat pipe 3.

Figure 7:
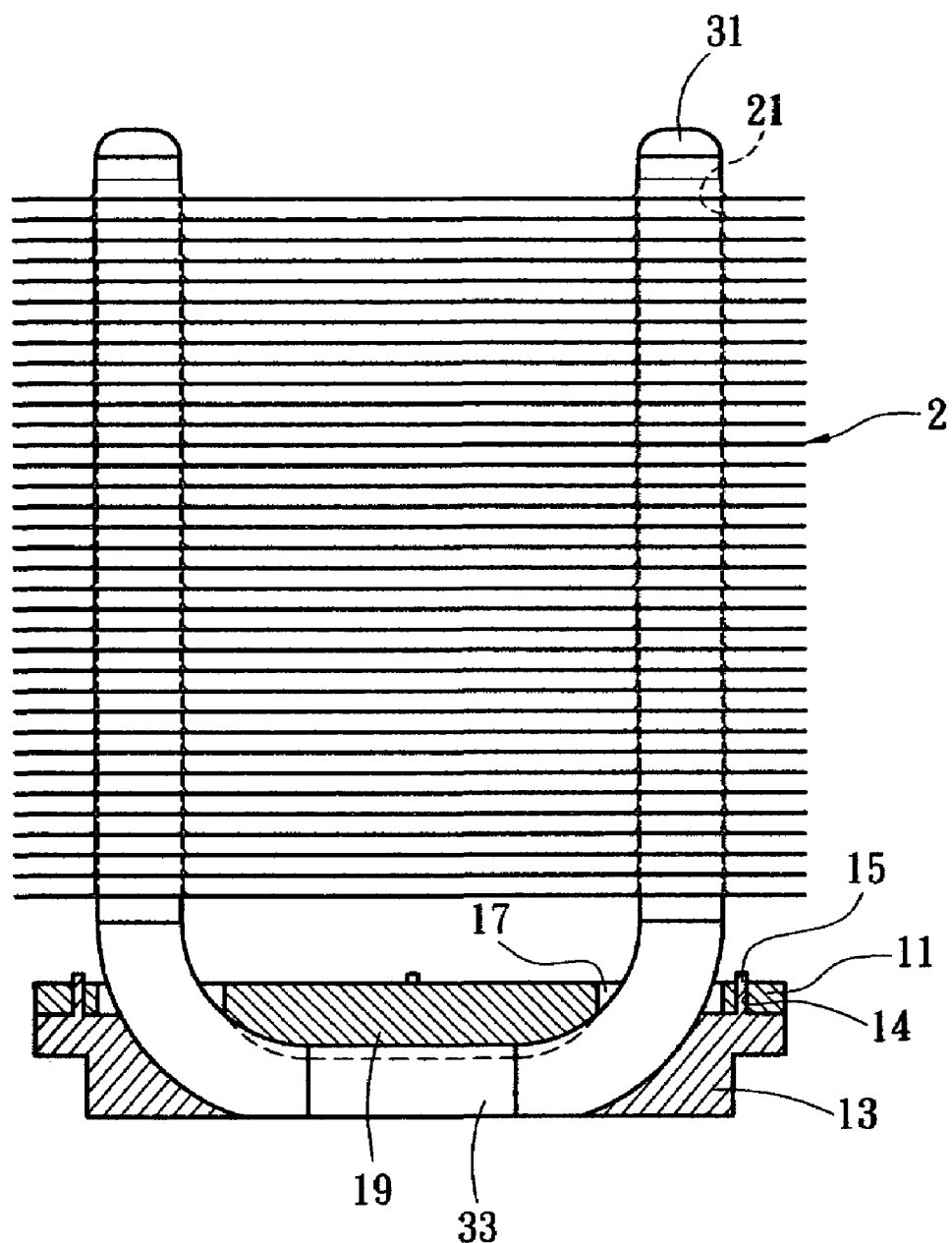
FIG. 7 is a side view illustrating the fourth manufacturing step of the present invention.

(7) As shown in FIG. 7, the through holes 17 of the upper cover 11 are aligned to the cooling end 31 of the heat pipe 3. The heat pipe 3 is pressed to the bottom base 13, thereby engaging the positioning portions 14, 15. In this manner, the upper cover and the base form a heat conductor.

(8) The upper cover 11 and the base 13 are tightly adhered, thereby pressing the absorption end 33 via the protrusive portion 19. The heat pipe 3 is then securely disposed in the heat conductor 1.

(9) As shown in FIG. 7, a plurality of symmetrically formed penetrating holes 21 is formed on the fins 2. The cooling end 31 of the heat pipe 3 penetrates the penetrating holes 21 and is connected with the fins 2. Consequently, a heat pipe cooling device including a heat conductor 1, a heat pipe 3 and a plurality of fins 2 is formed.

(10) As shown in FIG. 7, a planarization process is performed on the absorption end 33 of the heat pipe 3 that protrudes the bottom surface of the heat conductor 1. The absorption end 33 and the base 13 are then on the same plane.

The first positioning portion 14 and the second positioning portion 15 formed on the upper cover 11 and the base 13 can tightly connect the upper cover 11 with the base 13, and can precisely align the protrusive portion 19 and the through holes 17 with the retaining groove 12 and the cooling end 31 of the heat pipe 3. The upper cover 11 is precisely aligned with the base 13 via the engagement of the two positioning portions, thereby forming a heat conductor.

Referring to FIG. 3, in this particular embodiment of the present invention, the first positioning portion 14 is a sagged positioning hole, while the second positioning portion 15 is a protrusive positioning pillar. The engagement of the positioning hole and the positioning pillar allows the upper cover and the base being correctly aligned and connected. However, any person skilled in the art would readily appreciate any other positioning mechanisms that is considered within the scope of the present invention.

Figure 8:
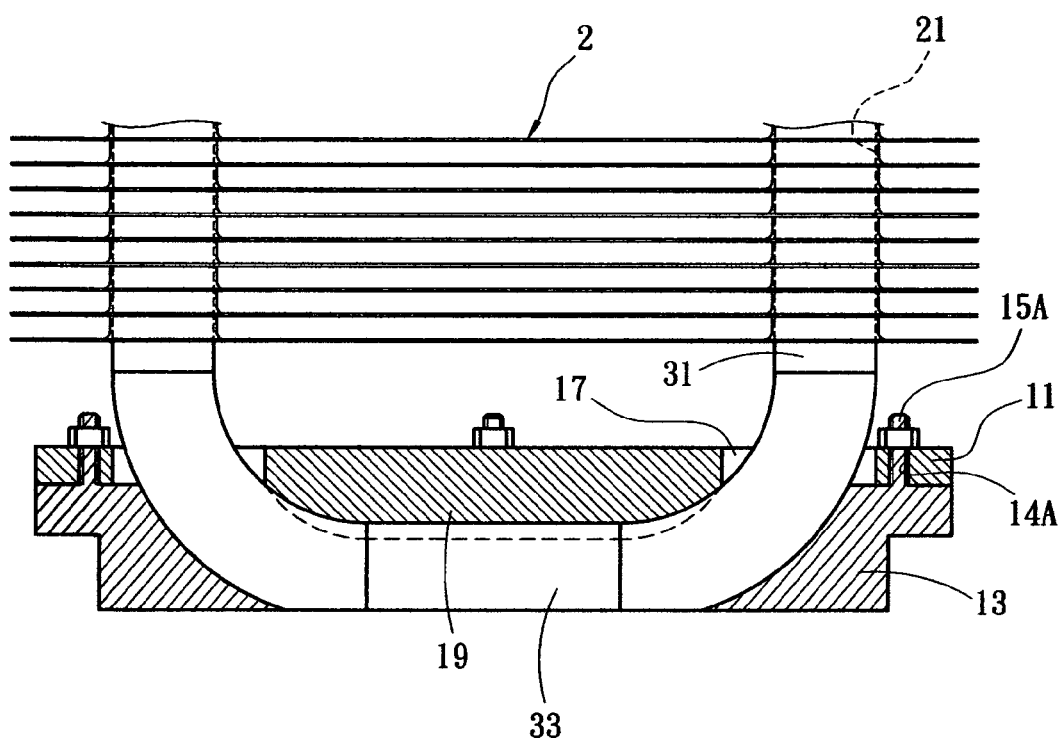
FIG. 8 illustrates a heat pipe cooling device, in accordance with another embodiment of the present invention.

Referring to FIG. 8, a heat pipe cooling device in accordance with another embodiment of the present invention is illustrated. As shown, the first positioning portion 14 is a through hole 14A. The second positioning portion is a threaded pillar 15A, which has a threaded patterned formed on one end thereof. The shape of the threaded pillar 15A is substantially the same as that of the through hole 14A. Therefore, the threaded pillar 15A can be engaged with the through hole 14A and is exposed outside of the heat conductor 1. Finally, a threaded nut is used to screw on the threaded pillar 15A, thereby securely fastening the upper cover 11 and the base 13.

Conventionally, only one side of the absorption end contacts the heat conductor. However, the absorption end 33 of the present invention is embedded into the heat conductor 1, which will largely increase the contact area between the heat pipe and the heat conductor. Therefore, a better performance on heat transfer is obtained. Furthermore, there is an heat conductor disposed between the heat pipe and the heat generating electronic device in the conventional cooling device. Since the heat conductivity of the heat conductor is much lower than that of the heat pipe, a direct contact of the heat pipe to the heat generating electronic device will largely enhance the cooling efficiency.

According to the method described above, the heat pipe 3 is securely disposed in the retaining groove 12 of the heat conductor 1 and then connecting the fins to the heat pipe. Moreover, the retaining groove 12 is penetrated on the base 13 of the heat conductor 1. Therefore, the absorption end 33 of the heat pipe 3 can contact the heat generating electronic device.

Meanwhile, since the heat pipe 3 is disposed in the heat conductor 1, a larger contact surface between the heat pipe 3 and the heat conductor 1 is obtained. The heat conductor can transfer heat more efficiently to the heat pipe for further dissipation. Therefore, the heat pipe cooling device of the present invention is advantageous over the convention art.

Conventionally, the combination of the heat pipe and the heat conductor requires a high temperature soldering process. Since the hot soldering process can oxidize the surface of the copper heat pipe, an additional oxidation reduction process is needed for recovering the copper surface to its original color. However, the present invention uses the upper cover 11 and the base 13 to quickly align and enclose the heat pipe 3 therein, thereby embedding the heat pipe 3 within the heat conductor 1. This can largely reduce the time and steps for fabricating the heat pipe cooling device, and lower the cost on raw material. Furthermore, no additional third media, e.g. soldering material, is needed for combining the heat pipe and the heat conductor. Therefore, the problem of thermal resistance caused by the third media does not exist any longer.

Since, any person having ordinary skill in the art may readily find various equivalent alterations or modifications in light of the features as disclosed above, it is appreciated that the scope of the present invention is defined in the following claims. Therefore, all such equivalent alterations or modifications without departing from the subject matter as set forth in the following claims is considered within the spirit and scope of the present invention.

What is claimed is:

1. A method for manufacturing a heat pipe cooling device, comprising the steps of:
    forming a retaining groove on a base for contacting a heat generating electronic device;
    forming a through hole on an upper cover, the bottom surface of which contacts the base, the position and the shape of the through hole corresponding to that of the cooling end of the heat pipe;
    compressing the heat pipe between the upper cover and the base, allowing the cooling end of the heat pipe to protrude the through hole, and connecting the upper cover and the base; and
    performing a planarization process to the absorption end of the heat pipe protruding the bottom surface of the heat conductor, thereby forming a flat surface for the absorption end and the base.

2. The method as recited in claim 1, wherein the upper cover and the base are connected by engaging a positioning pillar and a positioning hole.

3. The method as recited in claim 1, wherein the bottom surface of the upper cover includes a protrusive portion, the shape of which corresponds to that of the absorption end of the heat pipe.

4. The method as recited in claim 3, wherein the protrusive portion compresses the absorption end when the upper cover and the bottom base are tightly combined, thereby completely contacting the heat pipe with the upper cover and the base.

5. The method as recited in claim 1, further comprising a plurality of fins, which includes a plurality of symmetrically formed through holes, whereby the cooling end of the heat pipe can penetrate therethrough.

6. The method as recited in claim 1, wherein the through hole of the upper cover is aligned with the cooling end, which allows the upper cover to press down to the base, thereby forming a heat conductor.

7. The method as recited in claim 1, wherein the base is a substantially rectangular plate.

8. The method as recited in claim 1, wherein the shape of the bottom surface of the base is substantially the same as that of the heat generating electronic device.

9. The method as recited in claim 1, wherein the upper cover, the base and the fins are made of material of high heat conductivity.

10. The method as recited in claim 1, wherein the shape of the retaining groove is substantially the same as that of the absorption end of the heat pipe.

11. A heat pipe cooling device, comprising a heat pipe and a heat conductor, wherein:
    the heat conductor comprises an upper cover and a base connected to the upper cover, the base including at least a retaining groove formed thereon, the upper cover including at least a protrusive portion;
    the retaining groove and the protrusive portion being disposed corresponding to the absorption end of the heat pipe;
    the heat pipe being sandwiched between the upper cover and the base and fastened within the heat conductor;
    the retaining groove being an opening and the absorption end of the heat pipe penetrating the heat conductor through the retaining groove such that the bottom surface of the heat pipe is coplanar with the bottom surface of the base.

* * * * *